United States Patent [19]
Markland

[11] Patent Number: 4,704,723
[45] Date of Patent: Nov. 3, 1987

[54] FREQUENCY DIVIDER
[75] Inventor: Gunnar Markland, Bromma, Sweden
[73] Assignee: Telefonaktiebolaget LM Ericsson, STockholm, Sweden
[21] Appl. No.: 885,590
[22] PCT Filed: Dec. 11, 1985
[86] PCT No.: PCT/SE85/00518
 § 371 Date: Jun. 13, 1986
 § 102(e) Date: Jun. 13, 1986
[87] PCT Pub. No.: WO86/03633
 PCT Pub. Date: Jun. 19, 1986
[30] Foreign Application Priority Data
 Dec. 12, 1984 [SE] Sweden .............................. 8406314
[51] Int. Cl.⁴ .......................... G06F 7/02; H03K 23/66
[52] U.S. Cl. .......................................... 377/39; 377/48; 377/49
[58] Field of Search .............................. 377/39, 48, 49

[56] References Cited
U.S. PATENT DOCUMENTS
3,829,664 8/1974 Kashio .................. 377/39
4,318,046 3/1982 Sonntag ................ 377/48
4,468,796 8/1984 Suga .................... 377/39

*Primary Examiner*—John S. Heyman
*Attorney, Agent, or Firm*—Roberts, Spiecens & Cohen

[57] ABSTRACT

A method and apparatus for dividing a clock pulse frequency Cl in a ratio A/B, where the quotient between B and A is the whole number C and the remainder D. A pulse train is generated, which includes (A−D) half pulses with a pulse length of C clock pulses and also includes D half pulses with a length of (C+1) clock pulse lengths. The difference between C and (C+1) is the deviation in pulse length of the divided clock pulse frequency.

4 Claims, 3 Drawing Figures 4,704,723

FREQUENCY DIVIDER

FIELD OF INVENTION

The invention relates to a method and apparatus for achieving in a computer an optional division of a clock frequency C1 in a ratio A/B, where the quotient between B and A is a whole number C and a remainder D.

BACKGROUND

In a synchronous operation (e.g., between computer systems or between input/output means in digital telephone exchanges,) a timing accuracy of better than plus/minus 0.5% or is required, where the clock pulse frequency in the transmission of data may vary from 64 kHz to 1200 Hz. Particularly with high clock pulse frequencies, there is a problem when data is received by a computer for processing and distribution, this being to keep a constant data output flow within given accuracy limits for a continuous data input flow.

It is known to use a buffer store, where outgoing data are stored for transmission at a rate dependent on the space occupied in the buffer store. It is also known, with D/A signal conversion, to control a voltage-controlled oscillator depending on the degree of occupation in the buffer store, and subsequently to achieve frequency variations within the permitted plus or minus 0.5% via controllable division of the oscillator frequency. The method, however, requires a complicated circuit structure.

SUMMARY OF INVENTION

It is an object of the present invention to provide a method and an apparatus with the aid of which an optional division of the internal clock frequency of a computer may be effected in an easily integratable way in a system.

In achieving the above and other objects and advantages of the invention, there is provided an apparatus for dividing a clock frequency C1 according to a ratio A/B, where the quotient between B and A is a whole number C and a remainder D, and where a limited deviation in the pulse length of the divided frequency is permitted. In this apparatus, the clock pulses C1 include two half pulses equal in length to one another.

The aforesaid apparatus comprises first and second counters for generating counts, a bistable multivibrator, and first and second switches. The apparatus moreover comprises a first register for registering the number C, a second register for registering numbers A-D, and a third register for registering the number D. Also included is a divider which includes a first comparator circuit which receives the number registered in the first register and the count from the first counter.

The apparatus moreover includes a clock generating a clock signal at the frequency C1, the first counter being stepped forward one step for each half pulse of the clock signal having frequency C1 until it has reached the value of the number in the first register. The comparator circuit then sends a signal resetting the bistable multivibrator and also setting the first counter to zero, a signal being generated for stepping forward the second counter. The divider includes a second comparator circuit which receives the count from the second counter and also receives the number in the second register. When there is equality, this causes the second comparator circuit to send a signal which sets the second counter to zero and resets the first switch which then adds the number "1" to the number in the first register before connection to the first comparator takes place. It also resets the second switch to connect the third register instead of the second register to the second comparator circuit.

The method of the invention has to do with the above-stated relationship according to ratio A/B where the quotient of B and A is a whole number C and a remainder D. This method comprises storing C, A-D and D. It further comprises a sequence of counting the half pulses of the clock pulses to obtain a count which is compared to C and generating a first signal when the count equals C. Further included is the counting of the number of times the first signal is generated and comparing the resulting count with A-D and generating a second signal when the second said count equals A-D. C is then varied by 1 and D is compared with the number of times the first signal is generated. When equality is determined in the last comparison, the sequence is repeated. The first signal represents the divided clock pulse frequency.

BRIEF DESCRIPTION OF DRAWINGS

The invention will not be described in detail with reference to the accompaying drawings in which.

DETAILED DESCRIPTION

Figure 1:
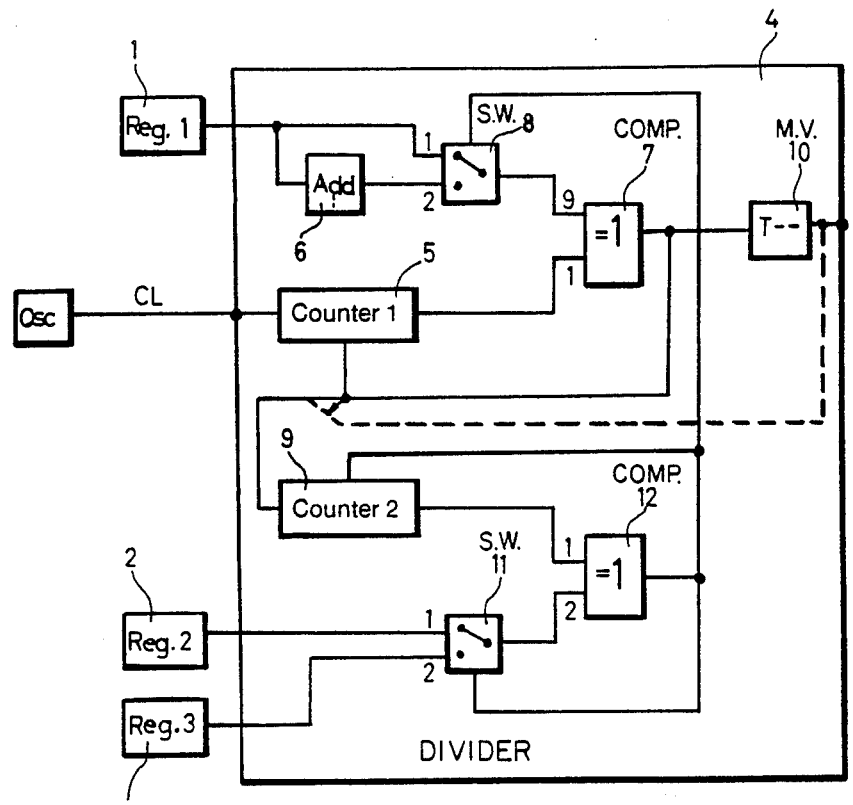
FIG. 1 is a block diagram showing, inter alia, an arrangement of registers and a dividing.

In FIG. 1 three registers 1, 2 and 3, each with its register content, are connected to a dividing unit 4. The internal clock Osc of a computer is also connected to dividing unit 4. The clock has a pulse frequency C1, which is to be divided according to a ratio A/B, where the quotient between B and A is a whole number C and the remainder D. In response this clock pulse, the half pulses of which are equal in length to one another, a first counter 5 is stepped forward one step for each half pulse. The count in this counter is compared with the register content C in the first register 1 in a first comparator circuit 7. Upon equality between the count and register content C, the circuit 7 sends a signal which sets a bistable multivibrator 10, the divided clock pulse being sent from its output. The signal also resets the counter 5 to zero. In a first embodiment, the signal also steps a second counter 9. In a second embodiment, the counter 9 is stepped by the half pulses at the output of the bistable multivibrator 10, as denoted by the dashed line in FIG. 1.

The count in the second counter 9 is compared in a second comparator circuit 12 with the register content (A-D) in the second register 2. Upon equality between this count and the register content (A-D), the comparator circuit 12 sends a signal setting the counter 9 to zero and also resetting two switches 8 and 11. In its reset state, the first switch 8 switches an adder circuit 6, which adds a "one" to the register content C in the first register 1. In another embodiment, (not shown in FIG. 1), the adding circuit 6 may be controlled in such a way that the "one" is subtracted from the content C of register 1. In its reset state, the second switch 11 substitutes the third register 3 for register 2 so that the content D of the third register is compared with the count in the second counter 9. Upon equality, the two switches 8, 11 are returned to their previous state, and the sequences described above are repeated. There is thus obtained a pulse train containing as many half pulses as the content (A−D) in the second register 2. The pulse length will be as many times as long as the pulse length of the clock pulse frequency C1 as is the register content C in the first register 1. The pulse train furthermore contains just as many half pulses as the content D in the third register 3, the pulse length here being as many times as long as the pulse length of the clock pulse frequency C1 as is the content of the first register 1 plus "one", i.e. (C+1).

Figure 2:
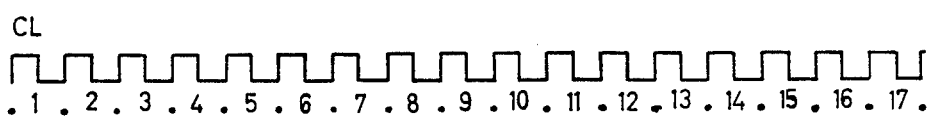
FIG. 2 is a chart which illustrates the shape of a divided clock pulse.
Figure 2:
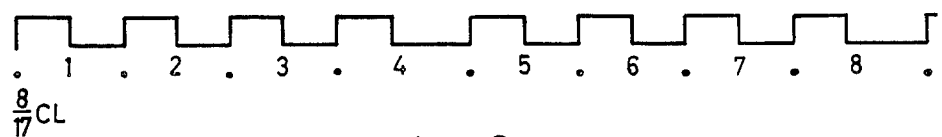
Figure 3:
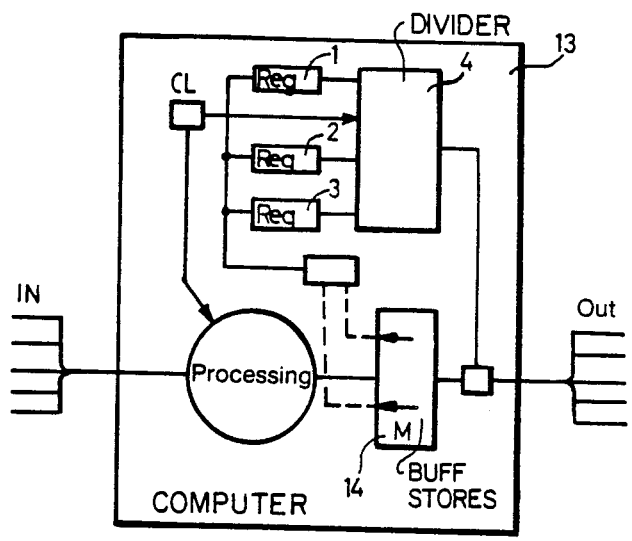
FIG. 3 illustrates and apparatus provided in accordance with the invention.

A division of the clock pulse frequency C1 to 8/17 of C1 is illustrated in FIG. 2. The quotient of 17 and 8 gives the whole number 2 and the remainder 1. The register 1 is then charged with the number 2, the register 2 with the number (8−1)=7 and the register 3 with the number 1. Seven half pulses are generated cyclically with a pulse length of 2 clock pulses and 1 half pulse with a pulse length of 3 clock pulses. The deviation in pulse length thus obtained is acceptable in certain applications. Such an application is described below in connection with FIG. 3.

A number of input means (IN) supplying data synchronously with a pulse frequency of 64 kHz are connected to a computer 13 having a clock frequency of 4 MHz. The frequency accuracy of the input means IN is better than plus or minus 0.5%. The data is processed in the computer and intermediately stored in a buffer store 14, from which data is fed out to a number of output means (OUT) connected to the computer, these latter means operating synchronously under the same conditions as the input means. It is essential for communication with the output means that the transmission speed is such that the buffer store is neither overfilled nor emptied. It is thus arranged that a first signal is sent when the level to which the store has been filled reaches a predetermined lower value, and that a second signal is sent when the filling level has reached an upper value. The rate at which data are supplied from the buffer store is controlled by these signals in the following manner. When the buffer store has reached the lower filling level the above mentioned first signal is sent. The first register 1 is then charged with the number 62, which is the whole number of the quotient between 64 kHz and 4 MHz. The second register 2 is charged with the number 1 and the third register 3 with the number 4. There is thus obtained a clock frequency divided down to 63.694 kHz (64 kHz minus 0.48%). This clock frequency controls the feedout from the buffer store until the upper filling level is reached. The second signal then sent causes a change in the contents of the registers such that the second register 2 is charged with the number 4 and the third register 3 with the number 1. The divided pulse frequency is thus increased to 64.309 kHz (64 kHz plus 0.48%). The procedure is repeated when the buffer store has been emptied to the lower level. The deviation 0.5 from the mean pulse length 62.5 is 0.8% per pulse, and the total deviation is 4×0.8=3.2.%.

I claim:

1. Apparatus for dividing a clock frequency C1 in a ratio A/B, where the quotient between B and A is a whole number C and a remainder D, and where a limited deviation in the pulse length of the divided frequency is permitted, a clock pulse C1 including two half pulses equal in length to one another, said apparatus comprising first and second counter means (5, 9) for generating counts, a bistable multivibrator means (10), first and second switch means, a first register (1) for registering the number C, a second register (2) for registering the number A−D, a third register (3) for registering the number D, and a divider means (4) which includes a first comparator means (7) which receives the number registered in the first register (1) and the count from said first counter means (5), clock means generating a clock signal at the frequency C1, said first counter means being stepped one step for each half pulse of the clock signal having frequency C1 until it has reached the value of the number in the first register (1), the comparator means (7) then sending a signal resetting said bistable multivibrator means (10) and also setting the first counter means (5) to zero, a signal being generated for stepping said second counter means (9), the divider means (4) including a second comparator means (12) which receives the count from the second counter means (9) and also the number in the second register (2) which, when there is equality, cause the second comparator means (12) to send a signal which sets the second counter means (9) to zero and also resets said first switch means (8) which then adds the number "one" to the number in the first register (1) before connection to the first comparator means (7) takes place, and also resets said second switch means (11) to connect the third register (3) instead of the second register (2) to the second comparator means (12).

2. Apparatus as claimed in claim 1, wherein the signal generated as the input of the second counter means (9) is the signal from the first comparator means (7), the second counter means being stepped one step for each signal from the first comparator means (7).

3. Apparatus as claimed in claim 1, wherein the signal supplied to the input of the second counter means (9) is the output signal from the bistable multivibrator means (10), the second counter means being stepped one step for each half pulse of the pulse frequency sent from the multivibrator means (10).

4. A method for dividing a clock pulse frequency of a train of clock pulses according to a ratio A/B where the quotient of B and A is a whole number C and a remainder D, the clock pulses being composed of half pulses of equal length, said method comprising storing C, A−D, and D; and a sequence of counting the half pulses to obtain a count which is compared with C, generating a first signal when said count equals C, counting the number of times said first signal is generated and comparing the resulting count with A−D, generating a second signal when the second said count equals A−D and then varying C by one and comparing D with the number of times said first signal is generated and when equality is determined therebetween repeating the sequence, the first signal representing the divided clock pulse frequency.

* * * * *